US010228402B2

(12) United States Patent
Krogsgaard et al.

(10) Patent No.: US 10,228,402 B2
(45) Date of Patent: Mar. 12, 2019

(54) HEARING AID AND A METHOD OF OPERATING A HEARING AID SYSTEM

(71) Applicant: Widex A/S, Lynge (DK)

(72) Inventors: Klaus Krogsgaard, Lyngby (DK); Jorgen Cederberg, Farum (DK)

(73) Assignee: Widex A/S, Lynge (DK)

( * ) Notice: Subject to any disclaimer, the term of this patent is extended or adjusted under 35 U.S.C. 154(b) by 0 days.

(21) Appl. No.: 15/625,559

(22) Filed: Jun. 16, 2017

(65) Prior Publication Data

US 2017/0350925 A1 Dec. 7, 2017

Related U.S. Application Data

(63) Continuation-in-part of application No. PCT/EP2014/078237, filed on Dec. 17, 2014.

(51) Int. Cl.
*G01R 27/16* (2006.01)
*H04R 25/00* (2006.01)

(52) U.S. Cl.
CPC ........... *G01R 27/16* (2013.01); *H04R 25/305* (2013.01); *H04R 25/70* (2013.01); *H04R 2460/15* (2013.01)

(58) Field of Classification Search
CPC .................................. G01R 27/16; H04R 25/70
USPC ......... 327/108, 175; 363/132; 381/120, 312, 381/313, 315, 316, 318, 331; 607/2; 123/608; 324/218; 330/10; 365/185.22; 455/41.1; 600/554
See application file for complete search history.

(56) References Cited

U.S. PATENT DOCUMENTS

| | | | | |
|---|---|---|---|---|
| 6,157,252 A | * | 12/2000 | Compton | H01L 29/94 257/E29.345 |
| 7,057,390 B1 | * | 6/2006 | Sinkine | H05H 7/04 315/209 R |
| 7,206,426 B1 | * | 4/2007 | Julstrom | H04R 25/558 381/315 |
| 8,174,294 B1 | * | 5/2012 | Ding | H04L 25/0272 326/85 |
| 8,189,833 B2 | * | 5/2012 | Klinkby | H04R 25/453 381/312 |
| 8,209,005 B1 | | 6/2012 | Moulder et al. | |
| 2005/0095983 A1 | * | 5/2005 | Schmidt | H01Q 7/00 455/41.1 |
| 2005/0207228 A1 | * | 9/2005 | Yamashita | B82Y 10/00 365/185.22 |
| 2006/0058700 A1 | * | 3/2006 | Marro | A61B 5/1106 600/554 |

(Continued)

FOREIGN PATENT DOCUMENTS

EP 1 097 606 B1 10/2005
EP 2 039 216 B1 9/2010

(Continued)

OTHER PUBLICATIONS

International Search Report of PCT/EP2014/078237 dated Nov. 10, 2015 [PCT/ISA/210].

(Continued)

*Primary Examiner* — Gerald Gauthier
(74) *Attorney, Agent, or Firm* — Sughrue Mion, PLLC

(57) ABSTRACT

A hearing aid (200), adapted for detection of congestion of a sound output. The invention also relates to a method of detection of congestion of a sound output.

11 Claims, 5 Drawing Sheets

(56) References Cited

U.S. PATENT DOCUMENTS

| | | | | |
|---|---|---|---|---|
| 2006/0217768 A1* | 9/2006 | Buhlmann | ............... | A61N 1/08 607/2 |
| 2007/0286441 A1* | 12/2007 | Harsch | ................... | H04R 25/30 381/315 |
| 2008/0119146 A1* | 5/2008 | Schmidt | ................... | H01Q 7/00 455/127.1 |
| 2009/0153208 A1* | 6/2009 | Lynch | ................ | G02F 1/13306 327/175 |
| 2012/0055455 A1* | 3/2012 | Ruan | ....................... | F02P 23/04 123/608 |
| 2012/0127769 A1* | 5/2012 | Kern | ................ | H02M 7/53871 363/132 |
| 2013/0188814 A1* | 7/2013 | Andersen | .................. | H03F 1/26 381/316 |
| 2013/0216076 A1* | 8/2013 | Knudsen | .............. | H03F 3/2173 381/312 |
| 2013/0223651 A1* | 8/2013 | Hoyerby | ............... | H03F 3/2173 381/120 |
| 2015/0188537 A1* | 7/2015 | Isoda | ................. | H03K 19/0185 327/108 |
| 2017/0311104 A1* | 10/2017 | Cederberg | ............. | H04R 25/70 |
| 2017/0350925 A1* | 12/2017 | Krogsgaard | ........... | G01R 27/16 |
| 2017/0350926 A1* | 12/2017 | Cederberg | ............. | G01R 27/16 |

FOREIGN PATENT DOCUMENTS

| | | |
|---|---|---|
| WO | 2011/110218 A1 | 9/2011 |
| WO | 2012/116720 A1 | 9/2012 |
| WO | 2012/116721 A1 | 9/2012 |

OTHER PUBLICATIONS

Written Opinion of PCT/EP2014/078237 dated Nov. 10, 2015 [PCT/ISA/237].

* cited by examiner

HEARING AID AND A METHOD OF OPERATING A HEARING AID SYSTEM

CROSS REFERENCE TO RELATED APPLICATIONS

This application is a continuation-in-part of International Application No. PCT/EP2014/078237, filed Dec. 17, 2014, the contents of which are incorporated herein by reference in its entirety.

The present invention relates to a hearing aid adapted for detection of congestion of a hearing aid sound output. The present invention also relates to a method of operating a hearing aid system in order to detect congestion of hearing aid sound output.

BACKGROUND OF THE INVENTION

Generally a hearing aid system according to the invention is understood as meaning any system which provides an output signal that can be perceived as an acoustic signal by a user or contributes to providing such an output signal and which has means adapted to compensate for an individual hearing loss of the user or contribute to compensating for the hearing loss. These systems may comprise hearing aids which can be worn on the body or on the head, in particular on or in the ear, and can be fully or partially implanted. However, those devices, whose main aim is not to compensate for a hearing loss, may also be considered a hearing aid system, for example consumer electronic devices (televisions, hi-fi systems, mobile phones, MP3 players etc.) provided they have, however, measures for compensating for an individual hearing loss.

Prior to use, the hearing aid is adjusted by a hearing aid fitter according to a prescription. The prescription is based on a hearing test, resulting in a so-called audiogram, of the performance of the hearing-impaired user's unaided hearing. The prescription is developed to reach a setting where the hearing aid will alleviate a hearing loss by amplifying sound at frequencies in those parts of the audible frequency range where the user suffers a hearing deficit.

In a traditional hearing aid fitting, the hearing aid user visits an office of a hearing aid fitter, and the user's hearing aids are adjusted using the fitting equipment that the hearing aid fitter has in his office. Typically the fitting equipment comprises a computer capable of executing the relevant hearing aid programming software and a programming device adapted to provide a link between the computer and the hearing aid.

Within the present context a hearing aid can be understood as a small, battery-powered, microelectronic device designed to be worn behind or in the human ear by a hearing-impaired user. A hearing aid comprises one or more microphones, a battery, a microelectronic circuit comprising a signal processor, an amplifier, and an acoustic output transducer. The signal processor is preferably a digital signal processor. The hearing aid is enclosed in a casing suitable for fitting behind or in a human ear.

The mechanical design of hearing aids has developed into a number of general categories. As the name suggests, Behind-The-Ear (BTE) hearing aids are worn behind the ear. To be more precise, an electronics unit comprising a housing containing the major electronics parts thereof is worn behind the ear. An earpiece for emitting sound to the hearing aid user is worn in the ear, e.g. in the concha or the ear canal. In a traditional BTE hearing aid, a sound tube is used to convey sound from the output transducer, which in hearing aid terminology is normally referred to as the receiver, located in the housing of the electronics unit and to the ear canal. In some modern types of hearing aids a conducting member comprising electrical conductors conveys an electric signal from the housing and to a receiver placed in the earpiece in the ear. Such hearing aids are commonly referred to as Receiver-In-The-Ear (RITE) hearing aids. In a specific type of RITE hearing aids the receiver is placed inside the ear canal. This category is sometimes referred to as Receiver-In-Canal (RIC) hearing aids.

In-The-Ear (ITE) hearing aids are designed for placement in the ear, normally in the funnel-shaped outer part of the ear canal. In a specific type of ITE hearing aids the hearing aid is placed substantially inside the ear canal. This category is sometimes referred to as Completely-In-Canal (CIC) hearing aids. This type of hearing aid requires an especially compact design in order to allow it to be arranged in the ear canal, while accommodating the components necessary for operation of the hearing aid.

Within the present context a hearing aid system may comprise a single hearing aid (a so called monaural hearing aid system) or comprise two hearing aids, one for each ear of the hearing aid user (a so called binaural hearing aid system). Furthermore the hearing aid system may comprise an external device, such as a smart phone having software applications adapted to interact with other devices of the hearing aid system. Thus within the present context the term "hearing aid system device" may denote a hearing aid or an external device.

Contemporary digital hearing aids incorporate a digital signal processor for processing audio signals from the microphone into electrical signals suitable for driving the acoustic output transducer according to the prescription. In order to save space and improve efficiency, some digital hearing aid processors provide a digital output signal to drive the acoustic output transducer directly without performing a digital-to-analog conversion of the output signal. If the digital signal is delivered to the acoustic output transducer directly as a digital bit stream with a sufficiently high frequency, the coil of the acoustic output transducer performs the duty as a low-pass filter, allowing only frequencies below e.g. 15-20 kHz to be reproduced by the acoustic output transducer. The digital output signal is preferably a pulse-width modulated signal, a sigma-delta modulated signal, or a combination thereof.

An H-bridge is an electronic circuit for controlling inductive loads such as electric motors or loudspeakers. It operates by controlling the direction of a flow of current through a load connected between the output terminals of the H-bridge by opening and closing a set of electronic switches present in the H-bridge. The switches may preferably be embodied as semiconductor switching elements such as Bipolar Junction Transistors (BJT) or Metal Oxide Semiconductor Field Effect Transistors (MOSFET). This operating principle permits a direct digital drive output stage to be employed in order to enable a suitably conditioned digital signal to drive a loudspeaker directly, thus eliminating the need for a dedicated digital-to-analog converter and at the same time reducing the power requirements for the output stage.

The present invention, in particular, relates to hearing aid systems comprising an ear canal part prepared for being arranged in the ear canal of a hearing aid user and wherein the ear canal part has at least one sound output opening or sound outlet provided with an ear wax guard. In traditional BTE hearing aids the sound output opening is connected to the receiver with a sound tube. For RITE, RIC, ITE and CIC hearing aids a short tubing (may also be denoted a sound bore) is normally used to convey the sound from the receiver and to the sound output opening.

It is a well-known problem that inside the ear canal the sound output opening is exposed to contamination with cerumen or ear wax which may lead to congestion of the sound output with consequently reduced sound reproduction. At worst, there may be a risk for the ear wax to enter the ear canal part and result in damage to the electrical components of the hearing aid such as the hearing aid receiver. In any case, a reduced level of the sound provided by the hearing aid system may have the consequence that the hearing aid system is not worn by a user or that a user having the hearing aid system on trial selects not to purchase it.

However, congestion of the sound output need not be due to ear wax it may also be the result of water condensation in the sound conduit between the receiver and the sound output opening.

In order to avoid ear wax from the human ear canal to enter through this sound output opening, an ear wax guard is usually applied. Such an ear wax guard is known from e.g. EP-B1-1097606. Ear wax guards are exchangeable and need to be replaced on a regular basis in order not to have the sound outlet blocked by ear wax. The time between changes of the ear wax guard varies between users, because the amount and characteristics of ear wax produced may differ significantly from person to person.

However as a consequence of the very small dimensions, the sound outlet typically having a diameter of about 1 mm, the insertion and removal of the ear wax guard is a rather difficult operation, especially for weak-sighted and elderly hearing aid users. As a consequence, it often happens that ear wax guards are not replaced as often as they should whereby the risk of ear wax entering the ear canal part is increased, hereby also increasing the risk of damaging especially the hearing aid receiver or increasing the risk of the hearing aid system providing sound at a significantly reduced level.

EP-B1-2039216 discloses a method for monitoring a hearing device comprising an electro-acoustical output transducer worn at or in a user's ear or in a user's ear canal, wherein the electrical impedance of the output transducer is measured and analyzed, whereby the status of the output transducer and/or of an acoustical system cooperating with the output transducer, such as a tubing of a BTE hearing device, may be evaluated in a simple and efficient manner. Thereby it is enabled to automatically and immediately recognize when the output transducer or an acoustical system cooperating with the output transducer is blocked by ear wax or when the output transducer is damaged.

EP-B1-2039216 more specifically discloses a method wherein a reference receiver impedance is initially measured at a resonance frequency for the receiver, and wax congestion is subsequently evaluated based on comparing additional measurements of the receiver impedance at said resonance frequency with the reference receiver impedance.

This method is characterized in that the difference between the additionally measured receiver impedances and the reference receiver impedance in addition to the change of the receiver impedance also depends on the amplitude of the signal used to measure the receiver impedance (in the following also denoted measurement signal) and depends on the magnitude of a measurement resistor applied in the receiver impedance measurement circuitry.

However, the amplitude of the measurement signal will typically drift with time and the specific environmental conditions because the source of the measurement signal will most likely be the hearing aid battery, which typically cannot be trusted to provide a constant voltage output over time. The method disclosed in EP-B1-2039216 does not describe how to compensate for possible variability of the battery voltage.

The method disclosed in EP-B1-2039216 is further disadvantageous in that the use of only one measurement resistor does not allow the sensitivity of a measured voltage that represents changes in the receiver impedance to be optimized for a broad range of different hearing aid receiver impedances, which is disadvantageous since most contemporary hearing aids may be fitted with several different types of receivers having reference impedances that may vary significantly. Typically the receiver type is selected based on the severity of the individual hearing loss and the size of the individual ear canal.

It is a feature of the present invention to provide a method of operating a hearing aid system that improves detection of possible mechanical congestion of a hearing aid due to e.g. ear wax or water.

It is another feature of the present invention to provide a hearing aid adapted to carry out said improved method.

SUMMARY OF THE INVENTION

The invention, in a first aspect, provides a hearing aid comprising: an H-bridge output stage having four branches wherein each branch has: two switches coupled in series, and a branching point that is positioned between the two switches and that is connected to a terminal of a hearing aid receiver either directly or through a resistor, wherein the branching point of a first and a second branch are connected directly to respectively a first and a second terminal of the hearing aid receiver, wherein the branching point of a third branch is connected to the branching point of the first branch through a first measurement resistor, and wherein the branching point of a fourth branch is connected to the branching point of the second branch through a second measurement resistor.

This provides an improved hearing aid adapted for detection of possible mechanical congestion of a sound output of the hearing aid.

The invention, in a second aspect, provides a method of operating a hearing aid system comprising the steps of: identifying a hearing aid receiver type, selecting a first measurement resistor from a group comprising at least two measurement resistors, measuring the impedance of a hearing aid receiver for at least one frequency and using the selected first measurement resistor; and determining if a sound output of the hearing aid system is at least partially congested based on the measured hearing aid receiver impedance.

This provides an improved method for detection of possible mechanical congestion of a sound output of a hearing aid.

Further advantageous features appear from the dependent claims.

Still other features of the present invention will become apparent to those skilled in the art from the following description wherein embodiments of the invention will be explained in greater detail.

BRIEF DESCRIPTION OF THE DRAWINGS

By way of example, there is shown and described a preferred embodiment of this invention. As will be realized, the invention is capable of other embodiments, and its several details are capable of modification in various, obvious aspects all without departing from the invention. Accordingly, the drawings and descriptions will be regarded as illustrative in nature and not as restrictive. In the drawings.

DETAILED DESCRIPTION

Within the present context a hearing aid electrical-acoustical output transducer may also be denoted a hearing aid receiver or simply a receiver.

The inventors have found a method of operating a hearing aid system that improves detection of possible mechanical congestion of a hearing aid due to e.g. ear wax or water. The method provides more precise and robust results while at the same time requiring less processing complexity and power. This is achieved by considering a change in a receiver resonance frequency relative to a reference receiver resonance frequency as opposed to e.g. considering the change of the magnitude of the receiver impedance measured at the reference receiver resonance frequency such as it has been disclosed in the prior art.

Figure 1:
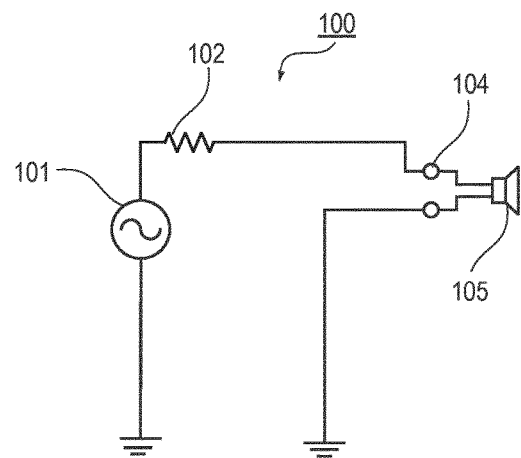
FIG. 1 illustrates a basic measurement circuitry in a hearing aid adapted to carry out a method of measuring a receiver impedance according to an embodiment of the invention.

Reference is first given to FIG. 1, which illustrates highly schematically a basic measurement circuitry 100 in a hearing aid adapted to carry out a method of measuring a receiver impedance according to an embodiment of the invention. The basic circuitry 100 comprises a signal generator 101, a measurement resistor 102, a measurement point 104 and a receiver 105.

The basic circuitry 100 can provide a measurement of the receiver impedance as a function of frequency (i.e. the impedance spectrum curve) by using the signal generator 101 to make a linear sine sweep while measuring the voltage at the measurement point 104. Hereby the change in receiver resonance frequency can be obtained by comparing the measured impedance spectrum curve relative to a reference impedance spectrum curve that is stored in the hearing aid system. The reference impedance spectrum measurement is typically carried out, and characteristics extracted therefrom are subsequently stored in the hearing aid system by a hearing aid professional as part of the final hearing aid fitting before handing over the hearing aid system to the user.

It is a specific advantage of the present invention that the reference measurement can be carried out in free space because this fact allows the hearing care professional to easily make sure that nothing obstructs the sound output opening during the reference measurement. The reference measurement can be carried out in free space because the impedance of the receiver is mostly affected by the resistance of the air pressure within the sound conduit of the hearing aid.

According to variations of the present embodiment the linear sine sweep test signal may be replaced by white noise, single/multiple sines at specific frequencies or exponential sine sweeps. The linear sine sweep is particularly advantageous due to its simple hardware implementation.

Figure 2:
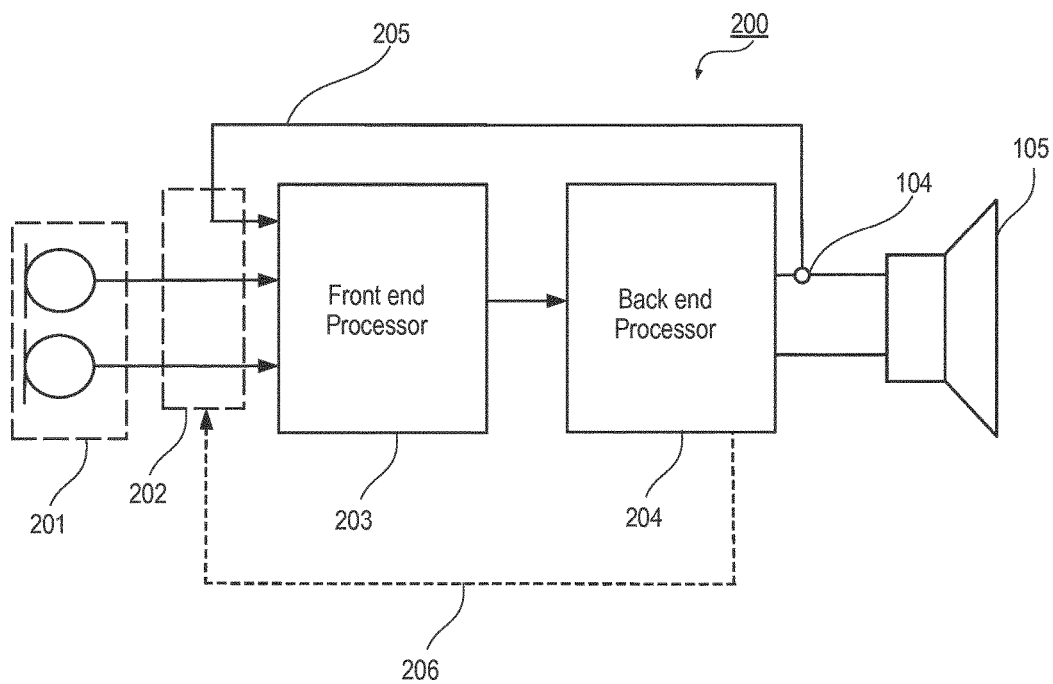
FIG. 2 illustrates highly schematically a hearing aid adapted to carry out a method according to an embodiment of the invention.

Reference is now given to FIG. 2, which illustrates highly schematically a hearing aid 200 adapted to carry out a method for operating a hearing aid according to an embodiment of the invention. The hearing aid 200 comprises a set of acoustical-electrical input transducers 201 (i.e. microphones), an input switching circuit 202, a hearing aid front end processor 203 and a hearing aid back end processor 204. In the following, the hearing aid front end processor and hearing aid back end processor may be denoted front end processor and back end processor or simply back end and front end. Basically the front end takes care of the analog-to-digital conversion of the input signal, while the back end carries out all the remaining hearing aid processing, especially the processing adapted for relieving the hearing deficit of a user.

The hearing aid 200 is adapted such that it can switch between being in a normal operation mode and being in a receiver measurement mode.

When the receiver measurement mode is selected, the hearing aid back end processor 204 initiates the measurements. This comprises the steps of controlling the signal generator 101 and the input switching circuit 202 as well as a signal detector (not shown for clarity). Initially the signal generator 101 applies a measurement signal to the output transducer 105. The voltage at the first measurement point 104 is fed to the front end 203, as the measurement signal 205, through the interaction of the input switching circuit 202, which is controlled by the back end 204 through the control signal 206 that allows the signal from the first measurement point 104 to be input to the front end and the analogue-to-digital converter (ADC) (not shown for clarity) comprised in the front end instead of the signals from the set of microphones 201. It is a specific advantage of the present embodiment that only a single ADC is required despite that the hearing aid may switch among two different modes of operation. However, it should be obvious to those skilled in the art that switching of the input signals could just as well be implemented after the ADC. This would require one ADC per input signal and a subsequent switching between the signals in the digital domain.

It is a further advantage that the ADC in both modes of operation outputs a digital signal wherein the DC part of the input signal to the ADC is removed, because this allows the same digital signal processing to be applied independent on whether the amplitude of the test signal varies due to e.g. an unstable voltage supply or ageing or otherwise drifting measurement resistors. According to the present embodiment the DC part of the input signal to the front end 203 is removed using a high pass filter up-stream of the ADC comprised in the front end 203.

The measurement principle is probably best understood by considering that at a first time $t_1$ a sine sweep $s(t)=\sin(2\pi ft)$ starts at frequency $f_1$ and increases linearly in time until it reaches frequency $f_N$ at a second point in time $t_N$. As discussed above the sine sweep is provided to the measurement point 104 at the output of the hearing aid and the resulting signal 205 is routed back to the hearing aid front end processor 203 where the analog signal is converted to the digital domain and provided to the back end processor 204 for further processing. The resulting signal 205 in the following denoted y(t), may thus be expressed as the convolution of the sine sweep s(t) with the transfer function h(t) of the combined receiver and series impedance:

$$y(t)=h(t)*s(t)$$

which in the frequency domain becomes:

$$Y(f)=H(f)S(f)$$

At time $t_i$, s(t) is a sine with frequency $f_i$, so the signal at the input side will only contain the frequency $f_i$, because the system is linear and the phase of the impedance is assumed negligible (that is, the impedance is considered purely resistive). The resulting signal at this frequency may therefore be expressed as:

$$Y(f_i)=H(f_i)S(f_i)=H(f_i)\exp(-j\omega_i)$$

at time $t_i$, where $\omega_i$ is the phase of the sine at time $t_i$. The amplitude of the resulting signal then becomes:

$$|Y(f_i)|=|H(f_i)\exp(-j\omega_i)|=|H(f_i)|$$

This means that the spectrum of the receiver impedance can be measured directly as the amplitude spectrum of the resulting signal. The resulting signal is provided to the front end processor 203 through the connection 205. The amplitude can be estimated using a variety of different methods, including the use of an abs-average estimator, the absolute value of a Hilbert Transform, or the absolute value of a Fourier transform. The amplitude estimation is calculated over a number of periods of the sine sweep in order to make the method insensitive to the phase of the signal.

Based on the obtained receiver impedance spectrum it is possible to identify a peak frequency and a valley frequency. According to the present embodiment this is done by selecting a frequency range for the measurement based on knowledge of the range of receivers and the corresponding acoustical systems (i.e. whether the hearing aid type is a traditional BTE type or a RITE/ITE/CIC type with a much shorter sound conduit between the receiver output and the sound output opening) that may be within the product range offered by the hearing aid manufacturer.

The inventors have found that the measured receiver impedance spectrum in most cases will exhibit a peak frequency and a valley frequency, wherein the peak is located at a lower frequency than the valley and wherein the peak reflects a parallel resonance of the system consisting of receiver and subsequent acoustical system while the valley reflects a series resonance of the system.

The detection of peaks and valleys can be carried out using a variety of methods that all will be obvious for a person skilled in the art. According to the present embodiment sample windows are used, whereby a frequency value is not interpreted as a peak before a number of subsequent samples, wherein the number is defined by the size of the sample window, have all been measured and been determined to have lower values. The size W of the sample window may be determined in accordance with the formula:

$$W = \frac{BW}{2F}D$$

wherein D represents the length in samples of the measurement signal, F represents the frequency range of the measurement signal and BW is the expected frequency bandwidth of the peak or valley to be detected.

After having found the peak frequency the valley frequency can be located using the same method.

According to an embodiment of the invention the detection of congestion of a sound output of a hearing aid is carried out based on the following steps:

The hearing care professional and the user selects a specific type of hearing aid receiver based primarily on the hearing deficit of the user, the size of the user's ear canal and the user's general preferences.

The hearing care professional ensures that information relating to and identifying the hearing aid type receiver is stored in the hearing aid system. This may be done manually by the hearing care professional as part of the final hearing aid system fitting prior to handing over the hearing aid system to the user. However, in an alternative embodiment the identification of the hearing aid receiver type may be carried out automatically using e.g. the methods and apparatus disclosed in EP-B1-2177052, and based upon this identification the relevant information is retrieved and stored in the hearing aid system.

Within the present context a sound output and sound output opening may be used interchangeably. This is because congestion may result as a consequence of different effects. Ear wax will typically congest a sound output opening and in particular an ear wax guard (which is typically positioned in the sound output opening) if the hearing aid has such a component. In situations with high humidity water may condensate inside the sound conduit between the hearing aid receiver and the sound output opening.

However, the measurement principles according to the present embodiment are independent on where in the sound output path the congestion is formed and also independent on the type of congestion material.

The inventors have discovered that the characteristics of the impedance spectrum for different hearing aid receiver types may differ significantly, and as a consequence hereof it is advantageous, if not required, to identify the hearing aid receiver type in order to set appropriate thresholds for determining when a hearing aid sound output opening may be considered congested, in order to determine whether a detection of peaks or valleys in the receiver impedance spectrum are to be used for determining possible congestion of the sound output opening, and in order to select the measurement resistor that is most appropriate for determining the receiver impedance spectrum for the identified receiver type.

In the following the more general term "receiver type" may be used interchangeably with the terms "receiver type and accompanying acoustical system" and "receiver type and hearing aid type", since the measured receiver impedance spectrum also depends on the corresponding acoustical system and because the acoustical system may be defined by the hearing aid type.

However, for the present embodiment, the hearing care professional provides, in a subsequent step, that a reference peak frequency of the receiver impedance spectrum is determined and stored in the hearing aid system.

Based on the determined receiver type and the determined reference peak frequency a peak frequency threshold is set, such that whenever a measured peak frequency exceeds this peak frequency threshold then the hearing aid is considered severely congested. This simple detection criteria is possible because the inventors have found that the peak frequency (and valley frequency) increases with the congestion, when the level of congestion exceeds a certain level. Thus for an intermediate level of congestion the peak frequency (and valley frequency) may decrease but ultimately the peak and valley frequencies will increase with the congestion. In fact the inventors have found that the level of congestion for which the measured peak and valley frequencies exceed the corresponding reference frequencies is the same level of congestion where the sound pressure level (SPL) provided from the congested hearing aid starts to decrease significantly.

However, according to a variation of the present invention or in combination with the present invention, a threshold frequency that is lower than the determined reference frequency may be used to indicate that congestion is close to becoming critical when the measured peak frequency (or valley frequency) decreases below this threshold frequency.

According to a variation of the present invention an automatic verification step is carried out before the determined reference peak or valley frequency is stored in the hearing aid system. Subsequently a measured reference resonance frequency is only allowed to be stored if it is within an expected range that depends on the automatic verification and wherein the expected range may be provided by the hearing aid manufacturer, because the hearing aid manufacturer is capable of providing information relating to the impact on the position of the resonance frequencies from the accompanying acoustical system. In case the measured reference frequency is not within the expected range, an alert may be provided.

According to a further embodiment the expected range for a plurality of receiver types and their accompanying acoustical systems may be stored on an external server that can be accessed by the hearing care professional, e.g. using the appropriate fitting software for the hearing aid.

Figure 3:
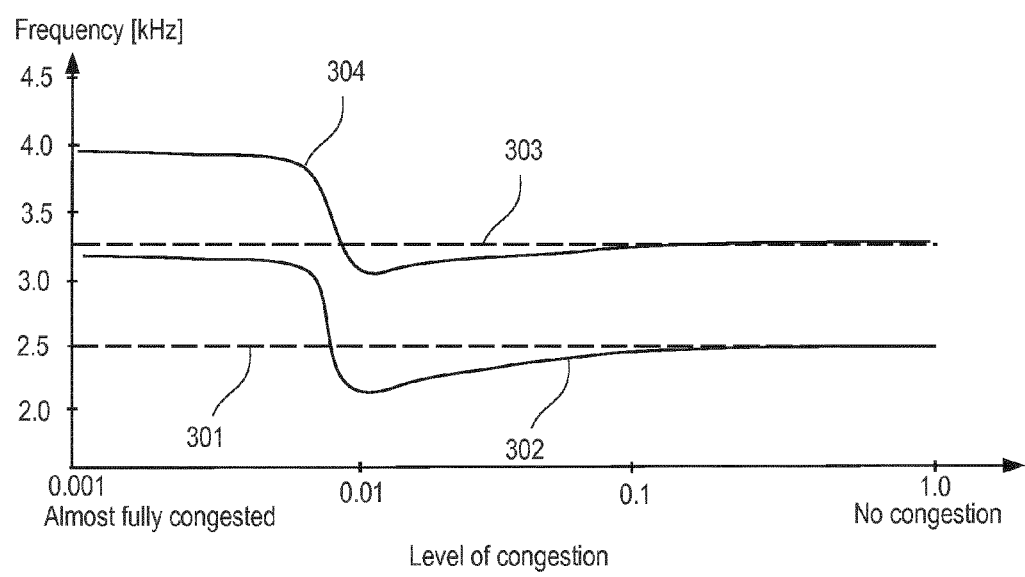
FIG. 3 illustrates an example of measured peak frequency and measured valley frequency as a function of congestion level for a given hearing aid and receiver type.

Consider now FIG. 3, which shows an example of measured peak frequency 302 and measured valley frequency 304 as a function of congestion level for a given hearing aid and receiver type. Also shown are the peak frequency 301 and the valley frequency 303 in the (reference) case of no congestion. FIG. 3 clearly illustrates how the measured peak and valley frequencies initially decrease with respect to the reference frequencies for increasing congestion, while above a critical congestion level the peak and valley frequencies increase relatively fast to frequencies significantly larger than the reference frequencies. Thus for the given hearing aid and receiver type the peak frequency threshold may be set to a value in the range between 2750 and 3000 Hz, while the valley frequency threshold may be set to a value in the range between 3500 and 3750 Hz.

This provides a method for congestion detection that is simple to implement and with improved measurement robustness since the method is independent on both the amplitude of the test signal and on the tolerances and possible drift of the measurement resistors, because these parameters have no impact on the measured peak and valley frequencies.

Furthermore, the inventors have surprisingly found that the detection of congestion can be significantly improved for some hearing aid receivers by considering a valley of the receiver impedance spectrum as opposed to considering a peak. In fact the inventors have found that for some receiver types it is simply not possible to use a peak frequency to detect congestion.

Perhaps even more surprisingly the inventors have also found, that for some hearing aid receiver types the variation of the reference valley frequency, for a sample of that specific receiver type, is so small that it is not necessary to measure a reference frequency for each individual receiver, instead the corresponding threshold valley frequency may be stored directly in the hearing aid system after identification of the given hearing aid receiver type.

Furthermore, the inventors have found that for yet some other hearing aid receiver types, the variation of the reference peak frequency, for a sample of that specific receiver type, may be so small that it is not necessary to measure a reference frequency for each individual receiver.

According to variations of the present embodiment various actions may be triggered in response to a detection of hearing aid congestion. These actions may be selected from a group comprising: issuing an acoustic alert, logging data related to the exceeded threshold in the hearing aid system and providing data related to the exceeded threshold to an external server.

According to a further variation an acoustic alert is only issued when a speech detector of the hearing aid system determines that no speech is present in the sound environment.

Considering again FIG. 1 it follows directly that the voltage $V_{aux}$ at the measurement point 104 is given as:

$$V_{aux} = V_{signal} \times \frac{Z_{receiver}}{(Z_{receiver} + R_{meas})}$$

wherein $V_{signal}$ is the AC voltage supplied by the signal generator 101, $Z_{receiver}$ is the receiver impedance to be determined, and $R_{meas}$ is the resistance of the measurement resistor 102.

In order to optimize the sensitivity of the measured voltage with respect to changes in the receiver impedance the voltage $V_{aux}$ is differentiated with respect to the receiver impedance $Z_{receiver}$ whereby a measure for the sensitivity is found and whereby the sensitivity can be optimized by differentiating with respect to the resistance of the measurement resistor 102 and finding an optimum by setting the expression for the differentiated sensitivity equal to zero:

$$V_{sensitivity} = \frac{dV_{aux}}{dZ_{receiver}} = V_{signal} \times \frac{R_{ref}}{(Z_{receiver} + R_{meas})^2}$$

$$\frac{dV_{sensitivity}}{dR_{meas}} = V_{signal} \times \frac{(Z_{receiver} + R_{meas}) - 2R_{meas}}{(Z_{receiver} + R_{meas})^3}$$

$$\frac{dV_{sensitivity}}{dR_{meas}} = 0 \xrightarrow{yields} Z_{receiver} = R_{meas}$$

Based on this the resistance of the measurement resistor 102 is preferably selected to be similar to the reference resistance of the receiver impedance in order to optimize the sensitivity of the measured voltage with respect to changes in the receiver impedance.

The inventors have found that the impedance of most receivers, suitable for use in hearing aid systems, are in the range of 10-1500 ohm. Therefore, according to a variation of the present embodiment, the basic circuitry 100 is adapted to include a switching circuit that allows the value of the measurement resistor 102 to be changed. According to a further variation the value of the measurement resistor 102 is changed in case a measurement of $V_{aux}$ shows that the resistance of the measurement resistor 102 is too far from the magnitude of the receiver impedance. This can be determined since the magnitude of $V_{aux}$ will be equal to half the magnitude of $V_{signal}$ when the magnitude of the receiver impedance $Z_{receiver}$ equals the resistance of the measurement resistor $R_{meas}$. As one example a first measurement resistor 102 with a resistance of 1000 ohm is used initially, and in case the magnitude of $V_{aux}$ drops below 30% of the magnitude of $V_{signal}$ then the first measurement resistor 102 is switched out and a second measurement resistor with a resistance of say 200 ohm is switched in, and by having this specific combination of resistance values for the reference resistor then the magnitude of $V_{aux}$ will stay in the range of 30-70% of the magnitude of $V_{signal}$ for receiver impedance values in the range between say 100-1500 ohm.

According to further variations the resistance values of the two measurement resistors are in the range of 500-1500 and 50-500 ohms respectively.

Furthermore the inventors have found that the frequency dependent variation of the receiver impedance may have such a magnitude that significantly improved measurement quality can be obtained by using different measurement resistors for different parts of the measured frequency spectrum.

Consider now FIGS. 4A-4D that illustrate highly schematically an H-bridge output stage 400 of a hearing aid according to an embodiment of the invention.

The output stage 400 comprises a first DC voltage supply 409, a second voltage supply 410, an output transducer 105, ground node 411, a first measurement resistor 412, a second measurement resistor 413, a first voltage measurement point 104a, a second voltage measurement point 104b and eight switches 401, 402, 403, 404, 405, 406, 407 and 408.

The output stage may be operated in a normal mode or in a measurement mode. In the normal mode the current to the receiver 105 is provided from the first DC voltage supply 409. In measurement mode the current to the receiver is provided from the second DC voltage supply 410, which provides a second DC voltage that is significantly lower than the first DC voltage from the first DC voltage supply. According to the present embodiment the first DC voltage is equal to the hearing aid battery voltage, and the second DC voltage is 30 dB lower than the battery voltage. The lower DC voltage may be provided by a simple voltage divider circuit.

In variations of the present embodiment the second DC voltage is in the range of 20 to 50 dB lower than the battery voltage.

The DC voltage may be supplied by a traditional hearing aid battery or by some rechargeable power source such as a fuel cell.

Figure 4A:
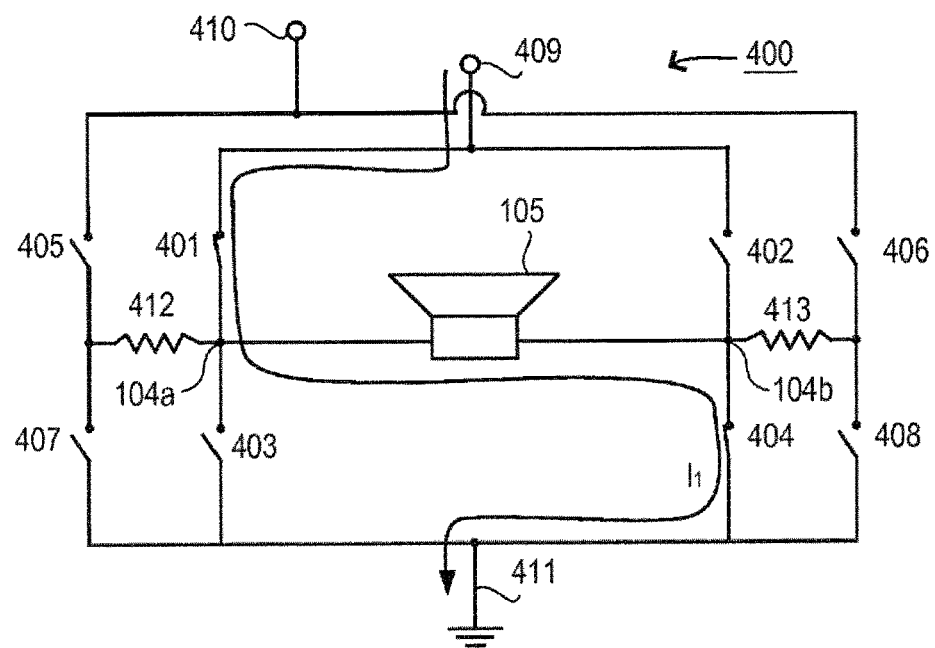
FIGS. 4A-4D illustrate highly schematically an H-bridge output stage of a hearing aid and its operation modes according to an embodiment of the invention.
Figure 4B:
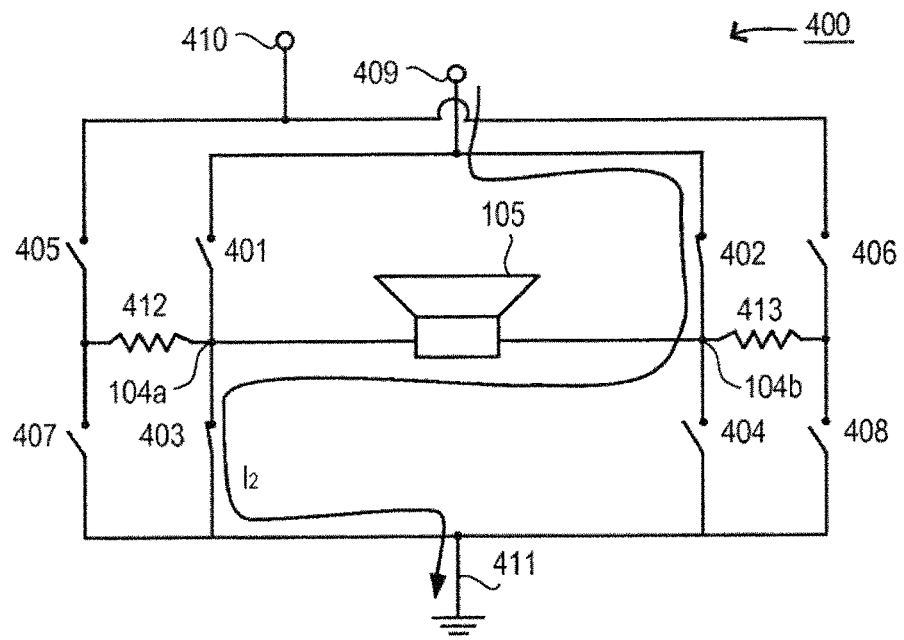

In the normal mode the switches 405-408 are kept in open position as illustrated in FIG. 4A and FIG. 4B, whereby no current flows through the measurement resistors 412 and 413. The switches 401-404 are operated such that the current flow (depicted as $I_1$) is through the output transducer 105 in a first direction from the left and to the right via the closed switches 401 and 404, while the switches 402 and 403 are open, which is the case depicted in FIG. 4A, or the current flow (depicted as $I_2$) is through the output transducer 105 in a second direction from the right and to the left when the switches 402 and 403 are closed, while the switches 401 and 404 are open, which case is depicted in FIG. 4B.

Depending on the direction of the current flow, the membrane or the diaphragm of the output transducer will move either inwards or outwards. Hereby the Sound Pressure Level (SPL) provided by the receiver 105 will be doubled compared to a case where the receiver 105 is driven by current pulses from only one direction.

However, in measurement mode it is generally necessary to have a measurement resistor coupled in series with the output transducer.

Figure 4C:
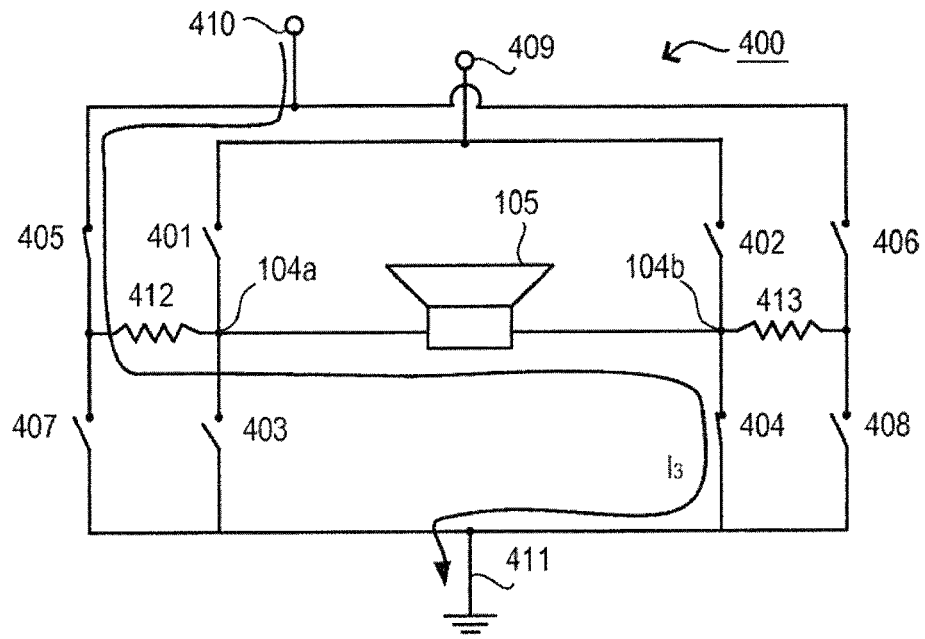
Figure 4D:
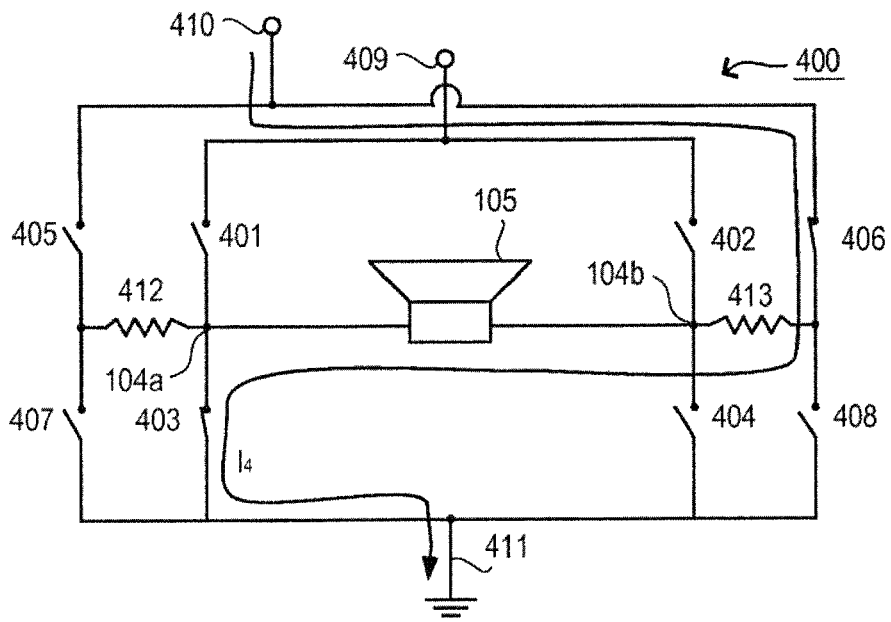

Consider now FIGS. 4C-4D, which illustrate the operation of the output stage 400 in measurement mode.

In a first case, a first receiver type has been identified and based here on the first measurement resistor 412 has been selected to be used in the measurements. The first measurement resistor 412 is coupled in series with the output transducer 105 by having, on the left side of the H-bridge, the switches 401, 403 and 407 open while 405 is closed, and on the right side of the H-bridge having the switches 402, 406 and 408 open while 404 is closed whereby the current flow (depicted as $I_3$) is through the output transducer 105 in a first direction from the left and to the right via the closed switches 405 and 404, which is the case depicted in FIG. 4C. In this case the amplitude receiver spectrum is derived from the voltage measured at the first voltage measurement point 104a.

In a similar manner the second measurement resistor 413 may be coupled in series with the output transducer 105 by having, on the left side of the H-bridge the switches 401, 405 and 407 open while 403 is closed and on the right side of the H-bridge having the switches 402, 404 and 408 open while 406 is closed whereby the current flow (depicted as $I_4$) is through the output transducer 105 in a second direction from the right and to the left via the closed switches 406 and 403. This is the case depicted in FIG. 4D. In this case the amplitude receiver spectrum is derived from the voltage measured at the second voltage measurement point 104b in order to ensure that the measured voltage reflects the receiver impedance in the same manner independent on whether the first or second measurement resistor are used for the measurements. A multiplexer will select whether the signal from the first or second voltage measurement point are provided to input switching circuit 202 and further on to the front end processor 203. Thus the voltage measurement point 104 of FIG. 2 may correspond to either the first or the second voltage measurement points of FIGS. 4A-D.

The measurement mode is characterized in that, for a given selected measurement resistor, the current flows through the receiver 105 in only one direction. This is not the case in normal operation where the currents flows in both directions as illustrated above in FIGS. 4A-4D. The advantage of having the current flow in both directions is that a larger receiver membrane movement and hereby sound pressure level may be achieved for a given magnitude of the DC voltage.

However, the inventors have found that this advantage is not required in measurement mode and consequently invented an output stage 400 that is highly symmetrical around the receiver 105, which is a significant advantage when implementing the output stage 400, while at the same time providing the option of selecting between two different measurement resistors whereby the measurement sensitivity can be improved, as discussed above.

Since the current pulses in measurement mode are always from the same direction, the inventors have found that the switch 405 is always closed when switch 407 is open and vice versa when the first measurement resistor is active, and the same is true for the switches 406 and 408 when the second measurement resistor is active. Hereby it is ensured that parasitic capacitances and receiver inductance are discharged in the periods between the current pulses.

As will be obvious for a person skilled in the art, the exact sound output level as well as the other time and frequency characteristics of the output signal may be controlled in a variety of ways, e.g. using pulse width modulation or pulse density modulation techniques.

In measurement mode the current to the receiver 105 is provided by the second DC voltage supply, which provides a DC voltage that is preferably 30 dB lower than the DC voltage used in normal operation. The use of a lower DC voltage provides a less noisy measurement signal, because the inherent class D amplifier noise scales with the DC voltage provided.

The lower noise is especially advantageous in the present context because it allows the use of test signals that provide a sound pressure level that in some cases will not be audible for the hearing aid user. A further advantage is that a critically high sound pressure level cannot by accident be delivered to the user during measurements because only a low DC voltage is available in measurement mode.

Furthermore the present invention is advantageous in that the measurement can be carried out within only one second.

According to other variations of the disclosed embodiments, the hearing aid is set up such that a measurement of the receiver spectrum is only carried out as part of the power up of the hearing aid or as part of a program change, since in these situations the disturbance that the user may perceive will be minimal. However, most users will not be able to hear the applied test signal, due to the low loudness.

According to still further variations of the disclosed embodiments the strength of a measurement signal used for measuring the electrical impedance is adapted, in at least one frequency range, in dependence on the hearing deficit of the hearing system user such that the measurement signal is not audible for the hearing system user.

According to yet further variations the strength of a measurement signal used for measuring the electrical impedance is adapted, in at least one frequency range, in dependence on the hearing deficit of the hearing system user such that the signal-to-noise is improved while the output level of the measurement signal is kept below the audible threshold for the hearing system user.

As will be obvious for a person skilled in the art the exact sound output level as well as the other time and frequency characteristics of the output signal may be controlled in a variety of ways, e.g. using pulse width modulation or pulse density modulation techniques.

Figure 5:
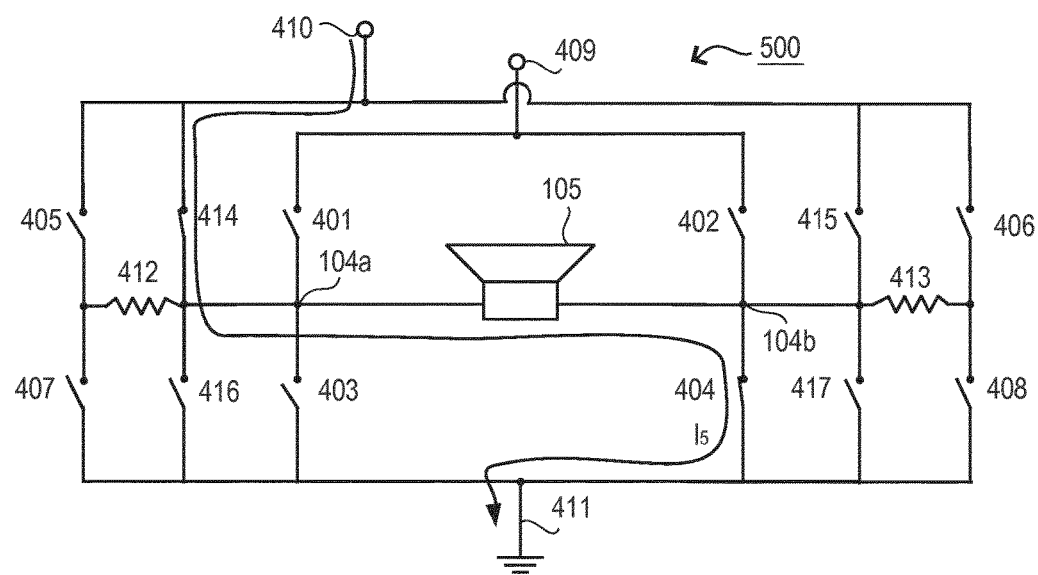
FIG. 5 illustrates highly schematically an H-bridge output stage of a hearing aid according to an embodiment of the invention.

Reference is now made to FIG. 5, which illustrates highly schematically an H-bridge output stage 500 of a hearing aid according to an embodiment of the invention.

The output stage 500 is similar to the output stage 400 of FIGS. 4A-D except for a first additional branch that comprises the switches 414 and 416 and a second additional branch that comprises the switches 415 and 417 wherein both the first and second additional branch is connected to the second DC voltage supply 410, whereby low noise signals can be provided, due to the reduced DC voltage from the second DC voltage supply, without having to include a measurement resistor. A current flow is depicted as $I_5$.

In variations of the disclosed embodiments the output stages 400 and 500 and the use of a first and a second DC voltage supply may be used in combination with basically any method that includes a receiver impedance measurement. I.e. the method needs not be directed at detecting congestion of a sound output and the method needs not be based on a monitoring of a peak or valley frequency shift.

In further variations the hearing aid mode of operation may be selected directly using an interface in an external device, such as a remote control or a smart phone, or using a selector accommodated in a hearing aid. The option where the user is capable of directly selecting the measurement mode is advantageous in that it allows the user to investigate immediately whether a hearing aid is congested.

However, the option where the receiver measurement mode is entered automatically with some regular or irregular intervals may be advantageous in that it may avoid that the user perceives a hearing aid with degraded performance because congestion may be detected before it becomes severe. According to this aspect of the invention, it is especially advantageous that the inventors have found that a threshold frequency that is lower than the determined reference frequency may be used to indicate that congestion is close to becoming critical when the measured peak frequency (or valley frequency) decreases below this threshold frequency.

The invention claimed is:

1. A hearing aid comprising:
   an H-bridge output stage having four branches wherein each branch has two switches coupled in series, and a branching point that is positioned between the two switches and that is connected to a terminal of a hearing aid receiver either directly or through a resistor,
   wherein
   the branching point of a first and a second branch are connected directly to respectively a first and a second terminal of the hearing aid receiver,
   the branching point of a third branch is connected to the branching point of the first branch through a first measurement resistor, and
   the branching point of a fourth branch is connected to the branching point of the second branch through a second measurement resistor.

2. The hearing aid according to claim 1, wherein the H-bridge is configured to:
   connect a first voltage source to the hearing aid receiver through the first and second branch, and
   connect a second voltage source to the hearing aid receiver through the third and fourth branch,
   and wherein the voltage supplied by the second voltage source is at least 30 dB lower than the voltage supplied by the first voltage source.

3. The hearing aid according to claim 2, wherein the output stage is adapted to operate either in a normal operation mode or a measurement mode and adapted such that the first voltage source provides the current to the hearing aid receiver when the output stage operates in normal operation mode and such that the second voltage source provides the current to the hearing aid receiver while the output stage operates in measurement mode.

4. The hearing aid according to claim 3, wherein the hearing aid in measurement mode is adapted to measure the voltage at the first or second terminal of the hearing aid receiver.

5. The hearing aid according to claim 1, wherein the resistance values of the first and second measurement resistors are selected from a range between 10 Ohm and 1500 Ohm.

6. The hearing aid according to claim 1, wherein the resistance value of the first measurement resistor is selected from the range between 50 and 500 Ohm and the resistance value of the second measurement resistor is selected from the range between 500 and 1500 Ohm.

7. A method of operating a hearing aid system comprising the steps of:
   identifying a hearing aid receiver type,
   selecting a first measurement resistor from a group comprising at least two measurement resistors,
   measuring the impedance of a hearing aid receiver for at least one frequency and using the selected first measurement resistor; and
   determining if a sound output of the hearing aid system is at least partially congested based on the measured hearing aid receiver impedance.

8. The method according to claim 7, wherein the selection of the first measurement resistor to be used for the measurement is based on the identified hearing aid receiver type.

9. The method according to claim 7, comprising the further steps of:
- measuring the impedance of the hearing aid receiver using a second measurement resistor instead of the first measurement resistor, and
- determining if a sound output of the hearing aid system is at least partially congested based on the measured hearing aid receiver impedance using the second measurement resistor.

10. The method according to claim 7, wherein the measurement resistor is coupled in series with the hearing aid receiver in order to allow the impedance of the hearing aid receiver to be determined using voltage division.

11. The method according to claim 7, wherein the step of measuring the impedance of the receiver is carried out using an output stage that during measurement mode is adapted to supply the current to the receiver from a voltage source that is adapted to provide a voltage that is at least 30 dB lower than the voltage provided during normal operation mode.

* * * * *